(12) United States Patent
Du et al.

(10) Patent No.: US 10,465,279 B2
(45) Date of Patent: Nov. 5, 2019

(54) SPUTTERING APPARATUS AND TARGET CHANGING DEVICE THEREOF

(71) Applicant: BOE TECHNOLOGY GROUP CO., LTD., Beijing (CN)

(72) Inventors: Jianhua Du, Beijing (CN); Can Wang, Beijing (CN); Xiaolong He, Beijing (CN); Xuefei Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/501,729

(22) PCT Filed: Jul. 27, 2016

(86) PCT No.: PCT/CN2016/091826
§ 371 (c)(1),
(2) Date: Feb. 3, 2017

(87) PCT Pub. No.: WO2017/063428
PCT Pub. Date: Apr. 20, 2017

(65) Prior Publication Data
US 2018/0209036 A1  Jul. 26, 2018

(30) Foreign Application Priority Data
Oct. 16, 2015 (CN) .......................... 2015 1 0672927

(51) Int. Cl.
H01J 37/34 (2006.01)
C23C 14/35 (2006.01)
C23C 14/34 (2006.01)

(52) U.S. Cl.
CPC .......... *C23C 14/35* (2013.01); *C23C 14/3407* (2013.01); *H01J 37/3414* (2013.01); *H01J 37/3435* (2013.01); *H01J 37/3488* (2013.01)

(58) Field of Classification Search
CPC .. C23C 14/3407; C23C 14/35; H01J 37/3414; H01J 37/3435; H01J 37/3488
(Continued)

(56) References Cited

U.S. PATENT DOCUMENTS 3,756,939 A * 9/1973 Hurwitt ............... C23C 14/3407
204/298.12
6,224,718 B1 5/2001 Meyer
(Continued)

FOREIGN PATENT DOCUMENTS

CN 1417372 A 5/2003
CN 1611631 A 5/2005
(Continued)

OTHER PUBLICATIONS

First Office Action for Chinese Application No. 201510672927.4, dated Apr. 5, 2017, 7 Pages.
(Continued)

*Primary Examiner* — Rodney G McDonald
(74) *Attorney, Agent, or Firm* — Brooks Kushman P.C.

(57) ABSTRACT

A sputtering apparatus and a target changing device thereof are disclosed. The target changing device includes a stand, a mounting shaft on the stand, a target mounting body sleeved on an outside of the mounting shaft and being rotatable around an axis of the mounting shaft, and a first driving mechanism configured to drive the target mounting body to rotate around the axis of the mounting shaft. The target mounting body includes at least two target mounting surfaces configured to mount targets. When the target mounting body rotates around the axis of the mounting shaft, each of the target mounting surfaces may be switched between an operating state orientation and an idle orientation.

16 Claims, 3 Drawing Sheets

(58) Field of Classification Search
USPC ............ 204/192.11, 298.04, 298.23, 298.26, 204/298.28
See application file for complete search history.

(56) References Cited

U.S. PATENT DOCUMENTS

| | | | |
|---|---|---|---|
| 2003/0085122 A1* | 5/2003 | Takahashi | C23C 14/3464 204/298.23 |
| 2005/0109616 A1 | 5/2005 | Ohta et al. | |
| 2007/0080056 A1 | 4/2007 | German et al. | |
| 2007/0089983 A1 | 4/2007 | Plaisted et al. | |
| 2008/0223714 A1 | 9/2008 | Tilsch et al. | |

FOREIGN PATENT DOCUMENTS

| | | |
|---|---|---|
| CN | 101297059 A | 10/2008 |
| CN | 101857951 A | 10/2010 |
| CN | 105154837 A | 12/2015 |
| JP | 2008223140 A | 9/2008 |
| TW | 201038759 A | 11/2010 |

OTHER PUBLICATIONS

International Search Report and Written Opinion for Application No. PCT/CN2016/091826, dated Nov. 1, 2016, 13 Pages.
Xu Binshi et al., Surface Engineering Technique Book (Descending)—p. 92, Chemical Industry Publishing House, First Ed., Published Jul. 2009, 3 Pages.
Tian Minbo, Thin Film Technology and Thin Film Material—p. 519, Publishing House of Tsing-Hua University, First Ed., Published Aug. 2006, 7 Pages.
1$^{st}$ Chinese Office Action, English Translation.
International Search Report and Written Opinion, English Translation.
CN1417372A, English Abstract and U.S. Equivalent U.S. Pub. No. 2003/0085122.
JP200822314A, English Abstract and U.S. Equivalent U.S. Pub. No. 2008/0223714.
CN1611631A, English Abstract and U.S. Equivalent U.S. Pub. No. 2005/0109616.
CN105154837A, English Abstract and Machine Translation.
CN101857951A, English Abstract and Machine Translation.
TW201038759A, English Abstract.
CN101297059A, English Abstract and U.S. Equivalent U.S. Pub. No. 2007/0089983.
Xu Binshi et al., Surface Engineering Technique Book (Descending), English Translation of Relevant Material (p. 92).
Tian Minbo, Thin Film Technology and Thin Film Material, English Translation of Relevant Material (p. 519).

* cited by examiner

SPUTTERING APPARATUS AND TARGET CHANGING DEVICE THEREOF

CROSS-REFERENCE TO RELATED APPLICATIONS

This application is the U.S. national phase of PCT Application No. PCT/CN2016/091826 filed on Jul. 27, 2016, which claims priority to Chinese Patent Application No. 201510672927.4 filed on Oct. 16, 2015, the disclosures of which are incorporated in their entirety by reference herein.

TECHNICAL FIELD

The present disclosure relates to the field of manufacturing display devices, in particular to a sputtering apparatus and a target changing device thereof.

BACKGROUND

Magnetron sputtering is one of physical vapor deposition methods. The principle of the magnetron sputtering is to eject target particles from the target surface by striking the target surface using high-energy particles formed through alternating current/direct current voltages in plasma, to attach the ejected target particles to a substrate surface and to constrain the charged particles using a magnetic field arranged at the target surface, so as to improve the plasma density and increase the sputtering rate. The magnetron sputtering is widely used in the sputtering film-forming process of TFT-LCD due to its high film-forming speed, good film-forming reproducibility and high step coverage rate.

The chamber of the sputtering film-forming device in the related art is usually provided with one target, and the chamber needs to be opened to manually change the target if the target is exhausted or the target needs to be changed for different production processes, resulting in a slow changing speed. The changing process is cumbersome since the chamber is vacuumized again after the changing of the target. Therefore, the production efficiency is reduced. In addition, due to the non-uniform magnetic field distribution within the chamber, the local etching rate of the target is large and the target consumption is non-uniform after long-time sputtering film-forming, thereby reducing the target utilization ratio.

SUMMARY

The present disclosure provides a sputtering apparatus and a target changing device thereof, which can realize automatically changing of targets without opening the chamber and improve the production efficiency.

To this end, the present disclosure provides a target changing device of a sputtering apparatus, which includes a stand, a mounting shaft, a target mounting body and a first driving mechanism. The mounting shaft is mounted on the stand. The target mounting body is sleeved on an outside of the mounting shaft and being rotatable around an axis of the mounting shaft. The first driving mechanism is configured to drive the target mounting body to rotate around the axis of the mounting shaft. The target mounting body includes at least two target mounting surfaces configured to mount targets, and each of the at least two target mounting surfaces is configured to switch between an operating state orientation and an idle orientation when the target mounting body rotates around the axis of the mounting shaft.

The target changing device includes at least two targets. When one target is to be changed, the target mounting body may be driven by the first driving mechanism to rotate so that a selected target mounted on the target mounting surface of the target mounting body switches from the idle orientation to the operating state orientation and the selected target participates in operation. During the target changing process of the target changing device, the chamber is not opened, thereby saving time for opening and closing the chamber and vacuumizing the chamber and then improving the production efficiency.

Optionally, the target changing device further includes a circuit module configured to control one target on the target mounting surface at the operating state orientation to be electrically connected with an operating circuit and to control one target on the target mounting surface at the idle orientation to be disconnected from the operating circuit.

Optionally, the target mounting body includes three target mounting surfaces, the target mounting body has a shape of a hollow equilateral triangle in cross section, and each of the three target mounting surfaces is oriented away from the mounting shaft.

Optionally, the first driving mechanism further includes: two rotation chucks and a first drive motor. The two rotation chucks are mounted on the stand and disposed at two opposite sides of end faces of the mounting shaft. The first drive motor includes an output shaft connected with the rotation chucks to drive the rotation chucks to rotate. The rotation axes of the two rotation chucks coincide with each other and are parallel to the axis of the mounting shaft, and each of the two rotation chucks is provided with a connecting mechanism at a side facing the mounting shaft, and the connecting mechanism cooperates with the target mounting body to drive the target mounting surfaces to rotate.

Optionally, the stand is provided with two slide rails arranged in parallel, and the mounting shaft is slidably mounted on the slide rails.

Further, the target changing device further includes a second driving mechanism which is configured to drive the mounting shaft to move between a target sputtering position and a target switching position.

Further, the second driving mechanism includes: a threaded screw provided on each of the slide rails and a second drive motor configured to drive the threaded screws to rotate. The threaded screws are parallel to an extending direction of the slide rails, and the mounting shaft is provided with threaded holes which are engaged with the threaded screws in a thread fit manner.

Further, the target changing device further includes a control module which is in signal connection with the first and second driving mechanisms and is configured to control the first and second driving mechanisms to start or stop.

The present disclosure further provides a magnetron sputtering apparatus which includes the above-mentioned target changing device and a magnetic field module configured to generate a magnetic field during a sputtering process of a target.

Optionally, the magnetic field module is inside the target mounting body.

In the magnetron sputtering apparatus, when the target is to be changed, a selected target may be switched to the operating position through the target changing device. The chamber is not opened during the switching process, thereby saving the time for opening and vacuumizing the chamber and improving the production efficiency. The magnetic mechanism is provided between the target mounting surfaces, and when the target is disposed at the sputtering position for sputtering, the magnetic mechanism moves with the target and the magnetic field generated by the magnetic mechanism moves with the target, thereby avoiding the phenomena that the target is non-uniformly consumed due to the fixed magnetic field and then improving the utilization ratio of the target.

DETAILED DESCRIPTION

The technical solutions of the embodiments of the present disclosure will be clearly and completely described below with reference to the accompanying drawings of the embodiments of the present disclosure. Apparently, the described embodiments are only part of the embodiments of the present disclosure, but not all the embodiments. All other embodiments obtained by a person of ordinary skills in the art without any creative work based on the embodiments of the present disclosure are intended to be within the scope of the present disclosure.

Figure 1:
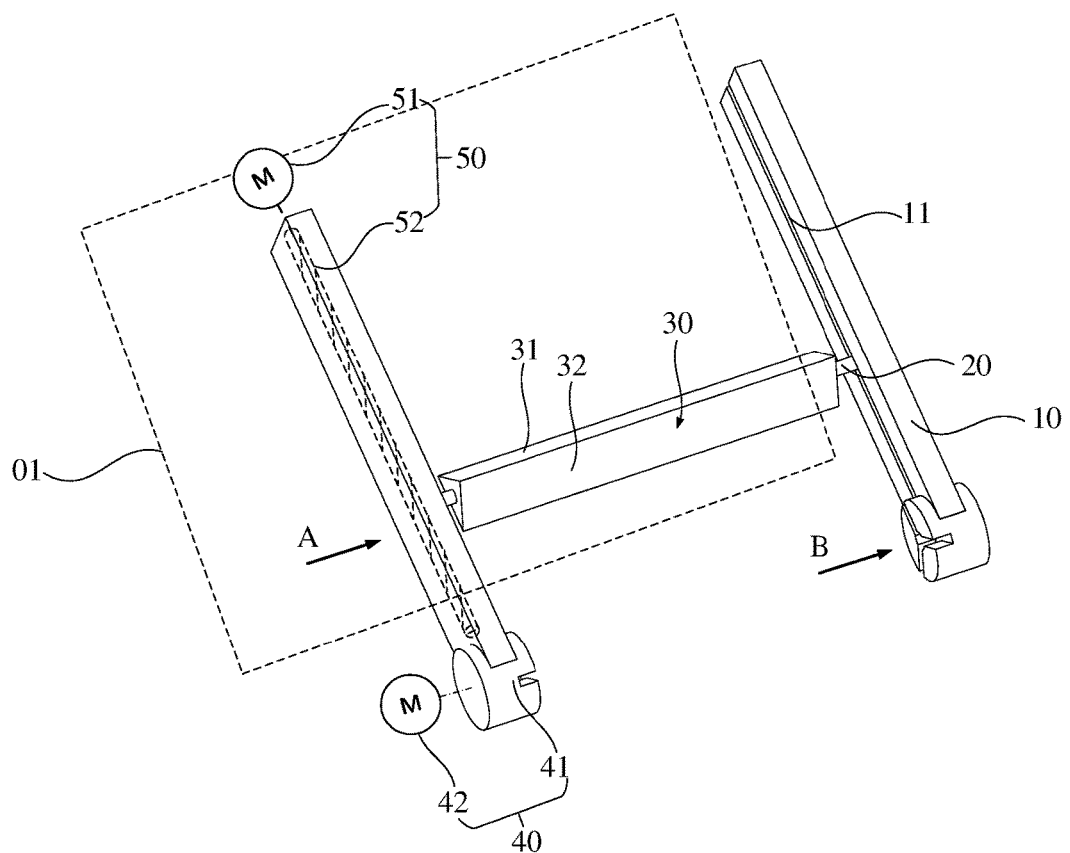
FIG. 1 is a schematic diagram of a target changing device of a sputtering apparatus provided by an embodiment of the present disclosure.
Figure 2:
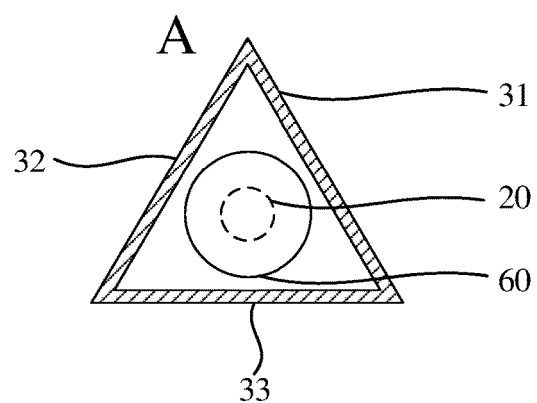
FIG. 2 is a schematic cross-sectional diagram of a partial structure of a target mounting body designated by a direction A in FIG. 1.

As shown in FIGS. 1 and 2, an embodiment of the present disclosure provides a target changing device of a sputtering apparatus. As shown in FIG. 1, the target changing device includes a stand 10, a mounting shaft 20 mounted on the stand 10, a target mounting body 30 sleeved on an outside of the mounting shaft 20 and being rotatable about an axis of the mounting shaft 20, and a first driving mechanism 40 to drive the target mounting body 30 to rotate about the axis of the mounting shaft 20.

In order to realize the target changing function, the target mounting body 30 has at least two target mounting surfaces, and may also have three or more target mounting surfaces in practical production. As shown in FIG. 2, in one embodiment, the target mounting body 30 includes three target mounting surfaces 31, 32, 33 for mounting targets. When the target mounting body 30 rotates about the axis of the mounting shaft 20, each of the target mounting surfaces may switch between an operating state orientation and an idle orientation. As shown in FIGS. 1 and 2, the operating state orientation is an orientation at which the target mounting surface 33, which is not shown in FIG. 1, is disposed to face the substrate 01. One target on the target mounting surface at the operating state orientation may be used for sputtering. The target mounting surfaces 31, 32 as shown in FIG. 1 are at the idle orientation.

In the practical use of the target changing device, each of the target mounting surfaces is provided with one target. When one target is to be changed, the target mounting body 30 may be driven by the first driving mechanism 40 to rotate so that a selected target mounted on one target mounting surface of the target mounting body 30 switches from the idle orientation to the operating state orientation and then the selected target participates in operation. During the process of changing targets, the chamber is not opened, thereby saving time for opening and closing the chamber and vacuumizing the chamber and then improving the production efficiency.

In an optional embodiment, the target changing device further includes a circuit module which is to control the target on the target mounting surface at the operating state orientation to be electrically connected with an operating circuit and to control the target on the target mounting surface at the idle orientation to be disconnected from the operating circuit.

Figure 5:
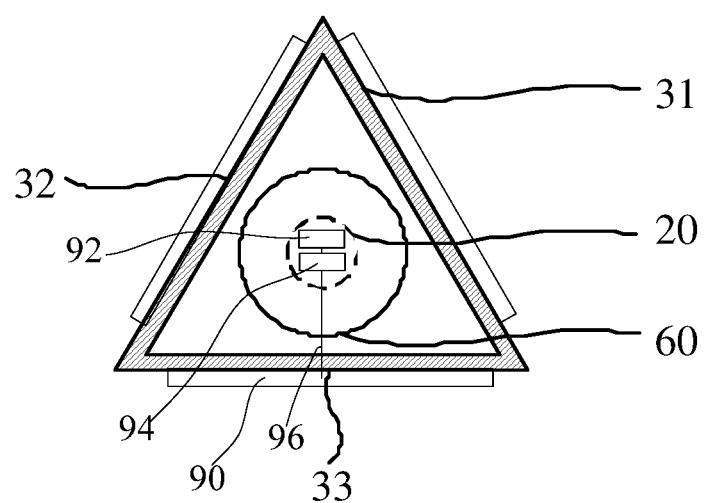
FIG. 5 is a schematic cross-sectional diagram of a partial structure of a target mounting body.

In an embodiment, as shown in FIG. 5, a circuit module 94 is electrically connected with a target 90 on the target mounting surface 33 at the operating state orientation through a wire 96, so as to control the target 90 on the target mounting surface 33 at the operating state orientation to be electrically connected with the operating circuit 92. The wire 96 may extend through the target mounting surface to be connected with the target 90, or may also extend to the outside of the target mounting body 30 to be electrically connected with the target 90.

In the optional embodiment as shown in FIG. 2, the target mounting body 30 has three target mounting surfaces 31, 32, 33, and the target mounting body 30 has a shape of a hollow equilateral triangle in cross section. The three target mounting surfaces 31, 32, and 33 are oriented away from the mounting shaft 20. In the practical production process, the target mounting body may be in a shape of a polygon prism for mounting a plurality of targets.

Figure 4:
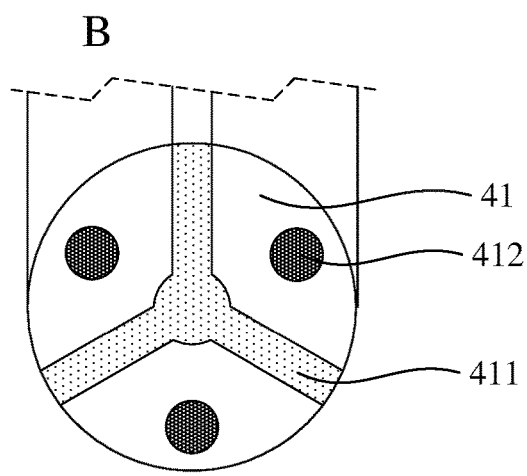
FIG. 4 is a schematic diagram of a partial structure of a rotation chuck designated by a direction B in FIG. 1.

In the optional embodiment as shown in FIG. 1, the first driving mechanism 40 includes two rotation chucks 41 which are mounted on the stand 10 and disposed at two opposite sides of end faces of the mounting shaft 20. As shown in FIG. 4, rotation axes of the two rotation chucks 41 coincide with each other and are parallel to the axis of the mounting shaft 20. Connecting mechanisms 412 are provided at one side of each rotation chuck 41, and the one side of each rotation chuck 41 faces the mounting shaft 20. The connecting mechanisms 412 cooperate with the target mounting body 30 to drive the target mounting surfaces to rotate. The first driving mechanism 40 further includes a first drive motor 42 with an output shaft connected with the rotation chuck 41 to drive the rotation chuck 41 to move.

In the practical production process, the connecting mechanism 412 may be implemented in a variety of ways, such as by means of a clamping mechanism, a snap-fit mechanism, a magnetic connection mechanism, etc. When the mounting shaft 20 is in a coaxial position with the rotation chucks 41, the connecting mechanisms 412 may cooperate with the target mounting body 30 by clamping both ends of the target mounting body 30, connecting with both ends of the target mounting body 30 in a snap-fit manner or magnetically attracting both ends of the target mounting body 30 to drive the target mounting body 30 to rotate.

In the optional embodiment as shown in FIG. 1, the stand 10 is provided with two slide rails 11 arranged in parallel. The mounting shaft 20 is mounted on the slide rails 11 and is capable of sliding along the slide rails 11.

Optionally, the target changing device further includes a second driving mechanism 50 which is to drive the mounting shaft to move between a target sputtering position and a target switching position.

In particular, the second driving mechanism 50 includes a threaded screw 52 provided on each of the slide rails 11 and a second drive motor 51 to drive the threaded screw 52 to rotate. The threaded screw 52 is parallel to an extending direction of the slide rails 11. The mounting shaft 20 is provided with threaded holes which are engaged with the threaded screw 52 in a thread fit manner.

Figure 3:
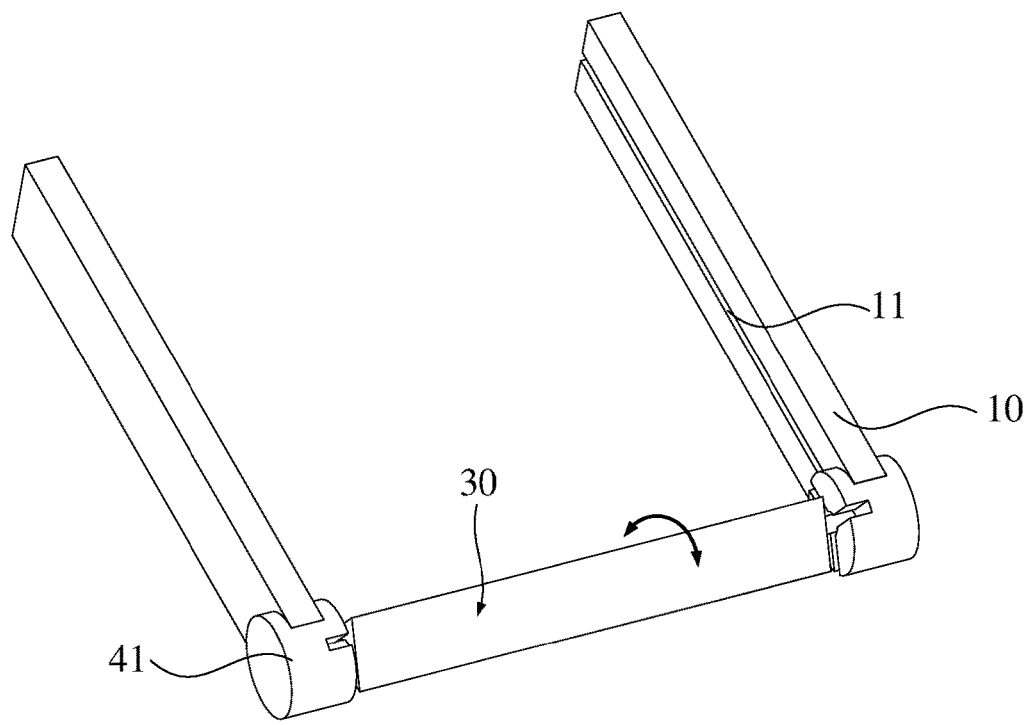
FIG. 3 is a schematic diagram of the target changing device in a targeting changing state provided by an embodiment of the present application.

As shown in FIGS. 1 and 3, the target sputtering position is a position as shown in FIG. 1 where the target mounting body 30 is driven by the threaded screw 52 to move along the slide rails 11. The target switching position is a position as shown in FIG. 3 where the target mounting body 30 is coaxial with the rotation chucks 41. As shown in FIG. 4, in practical production, the rotation chuck 41 is provided with a slide groove 411. When the target is to be changed, both ends of the mounting shaft 20 may be driven into the slide groove 411 by the threaded screw 52, so that the target mounting body 30 is arranged at the target switching position. Then, the target mounting body 30 is driven to rotate by the connecting mechanisms 412 on the rotating chucks 41, thereby rotating the selected target to the operating state orientation.

In an optional embodiment, the above-mentioned target changing device further includes a control module which is in signal connection with the first and second driving mechanisms and is to control the first and second driving mechanisms to start or stop.

One embodiment of the present disclosure further provides a magnetron sputtering apparatus, which includes the above-mentioned target changing device and a magnetic field module. The magnetic field module is to generate a magnetic field during the sputtering process.

In the magnetron sputtering apparatus, when one target is to be changed, a selected target may be switched to the operating position through the target changing device. The chamber is not opened during the switching process, thereby saving time for opening and vacuumizing the chamber and then improving the production efficiency.

In an embodiment as shown in FIG. 2, a magnetic field module 60 is provided in the target mounting body 30. When the target is disposed at the sputtering position for sputtering, the magnetic field module 60 moves with the target and the magnetic field generated by the magnetic field module 60 moves with the target, thereby avoiding the phenomena that the target is non-uniformly consumed due to the fixed magnetic field and then improving the utilization ratio of the target.

It will be apparent to those skilled in the art that various modifications and variations may be made to the embodiments of the present disclosure without departing from the spirit and scope of the present disclosure. Thus, it is intended that the present disclosure encompasses such modifications and variations, if such modifications and variations are within the scope of the present patent claims and equivalents thereof.

What is claimed is:

1. A target changing device of a sputtering apparatus, comprising:
   a stand;
   a mounting shaft on the stand;
   a target mounting body sleeved on an outside of the mounting shaft and being rotatable around an axis of the mounting shaft; and
   a first driving mechanism configured to drive the target mounting body to rotate around the axis of the mounting shaft;
   wherein the target mounting body comprises at least two target mounting surfaces configured to mount targets, and each of the target mounting surfaces is configured to switch between an operating state orientation and an idle orientation when the target mounting body rotates around the axis of the mounting shaft,
   wherein the stand is provided with two slide rails arranged in parallel, and the mounting shaft is slidably mounted on the slide rails.

2. The target changing device according to claim 1, further comprising a circuit module configured to control one target on the target mounting surface at the operating state orientation to be electrically connected with an operating circuit and to control one target on the target mounting surface at the idle orientation to be disconnected from the operating circuit.

3. The target changing device according to claim 1, wherein the target mounting body comprises three target mounting surfaces; the target mounting body has a shape of a hollow equilateral triangle in cross section; and each of the three target mounting surfaces is oriented away from the mounting shaft.

4. The target changing device according to claim 1, wherein the first driving mechanism comprises:
   two rotation chucks on the stand and at two opposite sides of end faces of the mounting shaft; and
   a first drive motor with an output shaft connected with the two rotation chucks to drive the two rotation chucks to rotate;
   wherein rotation axes of the two rotation chucks coincide with each other and are parallel to the axis of the mounting shaft; and each of the two rotation chucks is provided with a connecting mechanism at a side facing the mounting shaft, and the connecting mechanism cooperates with the target mounting body to drive the target mounting surfaces to rotate.

5. The target changing device according to claim 1, further comprising a second driving mechanism configured to drive the mounting shaft to move between a target sputtering position and a target switching position.

6. The target changing device according to claim 5, wherein the second driving mechanism comprises:
   a threaded screw on each of the slide rails; and
   a second drive motor configured to drive the threaded screws to rotate;
   wherein the threaded screws are parallel to an extending direction of the slide rails, and the mounting shaft is provided with threaded holes which are engaged with the threaded screws in a thread fit manner.

7. The target changing device according to claim 5, further comprising a control module which is in signal connection with the first and second driving mechanisms and is configured to control the first and second driving mechanisms to start or stop.

8. A magnetron sputtering apparatus, comprising: the target changing device according to claim 1 and a magnetic field module configured to generate a magnetic field during a sputtering process of a target.

9. The magnetron sputtering apparatus according to claim 8, wherein the magnetic field module is inside the target mounting body.

10. A target changing device of a sputtering apparatus, comprising:
    a stand;
    a mounting shaft on the stand;
    a target mounting body sleeved on an outside of the mounting shaft and being rotatable around an axis of the mounting shaft; and
    a first driving mechanism configured to drive the target mounting body to rotate around the axis of the mounting shaft;

wherein the target mounting body comprises at least two target mounting surfaces configured to mount targets, and each of the target mounting surfaces is configured to switch between an operating state orientation and an idle orientation when the target mounting body rotates around the axis of the mounting shaft, wherein the first driving mechanism comprises:

two rotation chucks on the stand and at two opposite sides of end faces of the mounting shaft; and a first drive motor with an output shaft connected with the two rotation chucks to drive the two rotation chucks to rotate;

wherein rotation axes of the two rotation chucks coincide with each other and are parallel to the axis of the mounting shaft; and each of the two rotation chucks is provided with a connecting mechanism at a side facing the mounting shaft, and the connecting mechanism cooperates with the target mounting body to drive the target mounting surfaces to rotate.

11. The target changing device according to claim 10, further comprising a circuit module configured to control one target on the target mounting surface at the operating state orientation to be electrically connected with an operating circuit and to control one target on the target mounting surface at the idle orientation to be disconnected from the operating circuit.

12. The target changing device according to claim 10, wherein the target mounting body comprises three target mounting surfaces; the target mounting body has a shape of a hollow equilateral triangle in cross section; and each of the three target mounting surfaces is oriented away from the mounting shaft.

13. The target changing device according to claim 10, further comprising a second driving mechanism configured to drive the mounting shaft to move between a target sputtering position and a target switching position.

14. The target changing device according to claim 13, further comprising a control module which is in signal connection with the first and second driving mechanisms and is configured to control the first and second driving mechanisms to start or stop.

15. A magnetron sputtering apparatus, comprising: the target changing device according to claim 10 and a magnetic field module configured to generate a magnetic field during a sputtering process of a target.

16. The magnetron sputtering apparatus according to claim 15, wherein the magnetic field module is inside the target mounting body.

* * * * *